Feb. 18, 1964 SAMUEL S. IM 3,121,828

TUNNEL DIODE DEVICES AND THE METHOD OF FABRICATION THEREOF

Filed Sept. 18, 1961

INVENTOR
SAMUEL S. IM

BY Everett A. Gartrell

ATTORNEY

United States Patent Office 3,121,828
Patented Feb. 18, 1964

3,121,828
TUNNEL DIODE DEVICES AND THE METHOD OF FABRICATION THEREOF

Samuel S. Im, Poughkeepsie, N.Y., assignor to International Business Machines Corporation, New York, N.Y., a corporation of New York Filed Sept. 18, 1961, Ser. No. 138,887
14 Claims. (Cl. 317—234)

The present invention is directed to tunnel diode devices and to the method of fabrication thereof. More particularly, the invention relates to germanium tunnel diode devices which have improved and more readily reproducible electrical characteristics.

The tunnel diode, like the conventional semiconductor diode, is a two-terminal semiconductor device comprising a semi-conductor body or region of one conductivity type separated from another region of the opposite type by a rectification barrier or junction. Unlike the conventional semiconductor device, the tunnel diode is an abrupt junction device having degenerate doping on both sides of the junction, the doping level being of the order of $10^{19}$ impurity atoms per cubic centimeter or greater. This is about four or five orders of magnitude greater than the doping level found in the usual semiconductor device. As a result, the phenomenon known as tunneling occurs during the operation of the tunnel diode and the latter exhibits a negative resistance region in its current-voltage characteristic when it is forwardly biased. This phenomenon, together with the tunneling characteristic of the diode, avoid the problem or shortcoming of minority carrier drift time which is present in most of the semiconductor devices and makes the tunnel diode a fast-operating device which is desirable for many purposes such as high-speed switching and the generation of very high frequency oscillations.

A variety of semiconductor materials such as germanium, silicon, silicon carbide, and intermetallic compounds have been employed as the parent bodies or starting wafers in making tunnel diodes. The starting wafer is very often given an N-type conductivity by heavily doping it with an active impurity material, and this may be accomplished by a variety of techniques which are well known in the art. Heavy doping during crystal growth, the quenching of heavily doped solutions, and solid-state diffusion have all been practised with materials such as germanium. It should be understood that P-starting wafers may also be employed in tunnel diodes. At present, most tunnel diodes are made using the alloy-junction technique for the production of an abrupt junction. When N-type semiconductor starting wafers of a material such as germanium are being utilized, the junction and its associated P-type recrystallized region are usually made degenerate by the application of acceptor impurities such as gallium, indium, aluminium, boron or other alloys. The material selected for the starting wafer is usually dictated by factors such as cost of materials, ease of fabrication, and the particular electrical characteristics desired in the tunnel diodes. For example, germanium tunnel diodes ordinarily have higher peak currents and peak-to-valley current ratios than such devices made of silicon which, on the other hand, have greater operating voltage swings. Intermetallic compounds such as gallium arsenide are materials capable of withstanding operation at high temperatures and usually are more costly than germanium or silicon.

P-type germanium starting wafers are useful in tunnel diode devices. Such wafers may be highly doped with gallium to levels which are up to $1 \times 10^{20}$ atoms per cubic centrimeter. Pettets of various alloys such as lead and antimony, lead and arsenic, and tin and arsenic have been alloyed therewith with only moderate success to create an N-type recrystallized region having a high impurity concentration and an abrupt PN junction. The lead serves as a carrier for the impurities antimony or arsenic. Tin has also been tried as a carrier for the impurities just mentioned but has the disadvantage of disturbing the lattice structure and undesirably increasing the valley current of the diode. While such tunnel diode devices have been satisfactory for some applications, it has been difficult to reproduce them consistently in quantities with uniform electrical characteristics. Because of the high doping levels employed in such devices, non-uniform capacitances may unfortunately result in a batch of tunnel diodes even when made under closely controlled conditions. It has been observed that a 1% change in the doping level of a tunnel diode made in a conventional manner from germanium may result in a 10% change in capacitance. It is very desirable to maintain the capacitance of the individual tunnel diodes of a manufactured batch thereof at relatively low values.

It is an object of the invention, therefore, to provide a new and improved germanium tunnel diode device which avoids one or more of the disadvantages of prior such devices.

It is another object of the invention to provide a new and improved germanium tunnel diode having an N-type recrystallized region formed on a P-type wafer.

It is a further object of the invention to provide a new and an improved germanium tunnel diode which has a low valley current.

It is a still further object of the invention to provide a new and improved method of making germanium tunnel diode devices having more uniform electrical characteristics including capacitance.

In accordance with a particular form of the invention, a tunnel diode device comprises a body of P-type germanium semiconductor material having an amount of impurity in the range of $1 \times 10^{19}$ to $1 \times 10^{20}$ atoms per cubic centimeter, and a PN junction in that body established by alloying therewith a pellet containing by weight arsenic within the range of 0.1 to 5%, antimony within the range of 0.1 to 10%, tin within the range of 15 to 80%, and the balance lead.

Also in accordance with the invention, the method of making a tunnel diode comprises alloying with a body of P-type germanium semiconductor material having an amount of impurity within the range of $1 \times 10^{19}$ to $1 \times 10^{20}$ atoms per cubic centimeter a pellet containing by weight arsenic within the range of 0.1 to 5%, antimony within the range of 0.1 to 10%, tin within the range of 15 to 80%, and the balance lead.

The foregoing and other objects, features and advantages of the invention will be apparent from the following more particular description of a preferred embodiment of the invention as illustrated in the accompanying drawing.

In the drawing:

FIG. 1(*b*) is a sectional view taken on the line 1—1 of FIG. 1(*a*); and

Figure 1B:
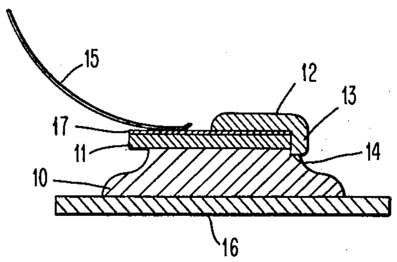
FIG. 1(*a*) is an enlarged plan view of a tunnel diode device which includes a semiconductor member in accordance with the present invention.
Figure 1A:
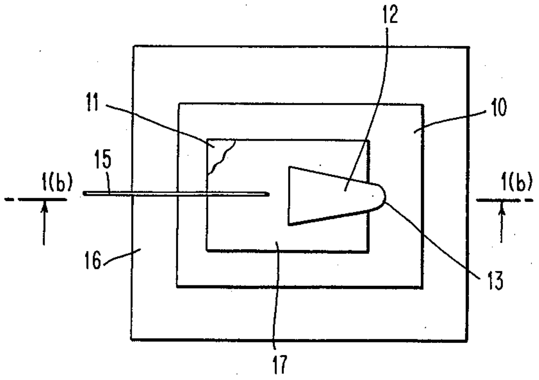

Referring now more particularly to FIGS. 1(*a*) and 1(*b*) of the drawing, the tunnel diode there represented may be one of the general type disclosed in the copending application of Edward M. Davis, Jr., Serial No. 106,-372, filed April 28, 1961, and entitled "Semiconductor Device and Method of Making It," and assigned to the same assignee as the present invention. To that end, the device comprises a body or starting wafer 10 of P-type germanium which is doped in a conventional manner with an impurity such as gallium in sufficient concentration to render the material degenerative. The doping level or amount of the impurity gallium may be in the range of $1\times10^{19}$ to $1\times10^{20}$ atoms per cubic centimeter. A doping level of $5\times10^{19}$ gallium atoms per cubic centimeter of germanium has been employed with considerable success.

The tunnel diode also includes an insulating member 11 of a suitable material such as silicon monoxide or quartz which is intimately attached to a portion of one surface of the semiconductor wafer 10. Member 11 may be applied to the upper surface of the wafer by evaporating of a film having a thickness of the order of 0.15 mil, a length of approximately 5 mils, and a width of about the same dimension. Evaporation may be accomplished in a conventional manner by evaporating the silicon monoxide through an apertured molybdenum mask.

The tunnel diode further includes an electrode 12 which is intimately attached to the upper surface of the insulating member 11 and has an overhanging portion 13 alloyed with the body member 10. Electrode 12 is made from an alloy member or pellet which is capable of creating a very thin PN junction 14. To that end, the pellet contains by weight arsenic within the range of 0.1 to 5%, antimony within the range of 0.1 to 10%, tin within the range of 15 to 80%, and the balance lead. As will be explained subsequently, arsenic is believed to be the active impurity of the pellet which, when alloyed with the germanium wafer 10, thins the transition region of the tunnel diode to about 75 angstroms and creates an N-type region at the overhang 13 in a manner well understood in the art. The electrode 12 is preferably attached to the member 11 by means of an electrically conductive film 17 which is evaporated on a portion of the member through an aperture in a molybdenum mask. Such evaporation techniques are well-known in the art. A pure nickel skin or a thin layer of silver deposited on a thin chromium sheath have proved satisfactory as the conductive film 17. The electrode 12 may be intimately attached to a portion of the coductive film 17 and to a portion of the wafer 10 by evaporating a pellet containing its four components through the aperture in a suitable molybdenum mask. Alternatively, the components of the pellet may be evaporated in succession on the exposed portions of the metal film 17 and the wafer, the arsenic being evaporated between the evaporation of two of the other components. After this, the alloying operation, to be described in greater detail subsequently, is undertaken to form the PN junction 14 between the overhang 13 and the semiconductor 10.

A connection in the form of a thin wire 15 has one of its ends attached to the metal film 17 in a suitable manner as by thermocompression bonding. Thermocompression bonding techniques have been published by H. W. Christensen in the April 1958 issue of the Bell Telephone Record at pages 127–130. Briefly, this procedure involves the application of heat and pressure by a chisel-edged tool to the end of the lead 15 resting on the metal film 17 so as to effect a good mechanical and electrical bond at the point of interconnection. A conductor in the form of a metal plate 16 is attached to the lower surface of the semiconductor wafer 10 with an ohmic solder, thus establishing with the wire 15, the film 17 and the electrode 12 electrical connections to opposite sides of the junction 14.

Figure 2:
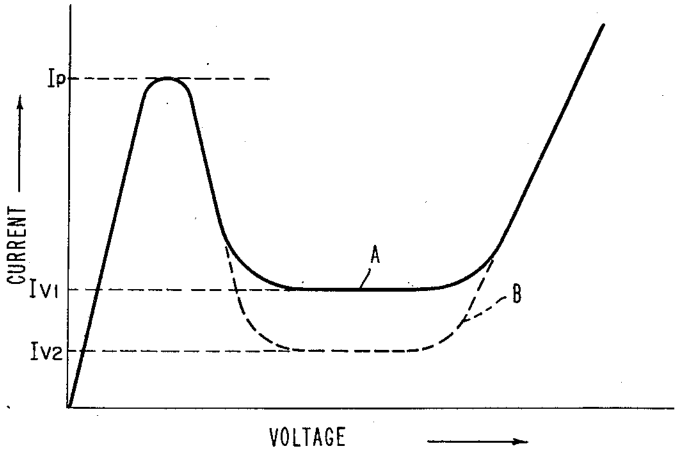
Fig 2 is a curve employed in explaining an advantage of the device of FIG. 1.

In the manner explained in the above-identified copending application of Edward M. Davis, Jr., an etching operation, which was performed to reduce the size of the PN junction 14 to a value which is effective to establish the desired current-voltage characteristic of the sort represented in FIG. 2, is also effective to remove some of the upper edge portions of the semiconductor wafer so that the insulating member 11 now overhangs a portion of the wafer as represented in FIG. 1(*b*).

In the past, the use of only tin and arsenic in the pellets employed in creating the alloy junctions in tunnel diodes has met with but limited success. In this instance, the tin has served as the carrier for the doping material arsenic. Although tin atoms have a large diameter in relation to that of germanium, tin rather strangely is capable of penetrating the germanium lattice quite easily. It is believed that the tin undesirably stretches the germanium lattice structure and this, in turn, creates an imperfect crystalline structure. When the latter is employed in a tunnel diode, there results an undesirable high valley current such as that represented by curve A of FIG. 2. Arsenic sublimates at a temperature of about 600° C. Consequently, it is not advisable to employ alloying temperatures greater than about 600° C. when that doping agent is employed in an alloying operation. On the other hand, the use of such a low alloying temperature reduces the doping level in the recrystallized region and this is undesirable in a tunnel diode which requires degenerative regions about the junction. Using lead instead of tin as a carrier for the arsenic would be unsatisfactory since the solid solubility of germanium and lead at about 600° C. is too low for the creation of a satisfactory junction.

A multi-component alloy pellet containing by weight arsenic within the range of 0.2 to 5%, antimony within the range of 0.1 to 10%, tin within the range of 15 to 80% and the balance lead overcomes the various difficulties just mentioned when alloyed with a degeneratively doped P-type semiconductor wafer. This may be accomplished by starting with the pellet and the wafer at room temperature and then introducing the assembly into an alloying furnace so that the temperature of the assembly increases to about 600° C. in several seconds, such as in five seconds. Thereafter, the assembly and the furnace are allowed to cool at a rapid rate to room temperature.

It has been established that the individual tunnel diode devices of a batch thereof made in the manner just mentioned have more uniform electrical characteristics. It is believed that the four elements in the pellet participate in the alloying operation with a P-type germanium wafer, in the manner presently to be considered, and produce a superior tunnel diode. The tin is believed to be the carrier for the arsenic which serves as the doping agent for creating the recrystallized N-type region. The lead in the alloy pellet is believed to dilute the tin therein so that its solid solubility in the germanium is not as great as it would otherwise be. This in turn desirably reduces the lattice deformation and the valley current of the tunnel diode from a value $I_{v_1}$ to a value $I_{v_2}$, the latter being represented by the broken-line region of curve B of FIG. 2. It will also be seen from FIG. 2 that the peak-to-valley current ratio $$\frac{Ip}{I_{v2}}$$

is considerably improved. The antimony in the pellet serves the important function of being the primary wetting agent by reducing the surface tension of the pellet during alloying. As a result, individual transistors of a manufactured batch are alloyed better, and their capacitance is more uniform as are also other electrical characteristics of the device such as the valley current and the peak-to-valley current ratio. Arsenic is recognized as doping element which is difficult to employ with the assurance that the extent of the doping will not vary from unit to unit under identical fabrication conditions. Non-uniformity in doping by the arsenic produces a corresponding non-uniformity in the capacitance of the tunnel diodes. Experience has indicated that the improved wetting promoted by the presence of the arsenic and the participation of the other elements of the multi-component pellet in the alloying operation result in the production of tunnel diodes having a more uniform capacitance.

While applicant does not wish to be limited to any particular values or proportions for the various elements employed in making a tunnel diode, the following were used in and resulted from the manufacture of several hundred thereof and are given by way of example only:

| | Example 1 (100 units) | Example 2 (100 units) | Example 3 (100 units) |
|---|---|---|---|
| P-type germanium wafer Gallium doping. | $5\times10^{19}$ atoms per cu. cm. | $5\times10^{19}$ atoms per cu. cm. | $5\times10^{19}$ atoms per cu. cm. |
| Pellet composition: | | | |
| Arsenic | 2% | 2% | 2%. |
| Antimony | 5% | 5% | 5%. |
| Tin | 18.6% | 46.5% | 70%. |
| Lead | 74.4% | 46.5% | 23%. |
| Average peak-to-valley Current Ratio. | 10/1 | 12/1 | 11/1. |
| Average capacitance for each milliampere of current-carrying capacity of diode. | 0.8 picofarad | 0.9 picofarad | 1 picofarad. |

While the invention has been shown and described with reference to a preferred embodiment thereof, it will be understood by those skilled in the art that various changes in form and details may be made therein without departing from the spirit and scope of the invention.

What is claimed is:

1. A tunnel diode device comprising: a body of P-type germanium semiconductor material having an amount of impurity in the range of $1\times10^{19}$ to $1\times10^{20}$ atoms per cubic centimeter; and a PN junction in said body established by alloying therewith a pellet containing by weight arsenic within the range of 0.1 to 5%, antimony within the range of 0.1 to 10%, tin within the range of 15 to 80%, and the balance lead.

2. A tunnel diode device comprising: a body of P-type germanium semiconductor material having an amount of impurity in the range of $1\times10^{19}$ to $1\times10^{20}$ atoms per cubic centimeter; a PN junction and an N-type recrystallized region in said body established by alloying therewith a pellet containing by weight arsenic within the range of 0.1 to 5%, antimony within the range of 0.1 to 10%, tin within the range of 15 to 80%, and the balance lead; and electrical connections to said P-type body and to said N-type region.

3. A tunnel diode device comprising: a body of P-type germanium semiconductor material including the active impurity gallium in the range of $1\times10^{19}$ to $1\times10^{20}$ atoms per cubic centimeter; and a PN junction in said body established by alloying therewith a pellet containing by weight arsenic within the range of 0.1 to 5%, antimony within the range of 0.1 to 10%, tin within the range of 15 to 80%, and the balance lead.

4. A tunnel diode device comprising: a body of P-type germanium semiconductor material including the active impurity gallium in the range of $1\times10^{19}$ to $1\times10^{20}$ atoms per cubic centimeter; a PN junction in said body established by alloying therewith a pellet containing by weight arsenic within the range of 0.1 to 5%, antimony within the range of 0.1 to 10%, tin within the range of 15 to 80%, and the balance lead; a conductive plate ohmically soldered to said P-type body; and a lead conductively connected to said alloyed pellet.

5. A tunnel diode device comprising: a body of P-type germanium semiconductor material having an amount of impurity of approximately $5\times10^{19}$ atoms per cubic centimeter; and a PN junction in said body established by alloying therewith a pellet containing by weight substantially 2% arsenic, substantially 5% antimony, tin within the range of 18.6 to 70%, and the balance lead.

6. A tunnel diode device comprising: a body of P-type germanium semiconductor material having an amount of impurity of approximately $5\times10^{19}$ atoms per cubic centimeter; and a PN junction in said body established by alloying therewith a pellet containing by weight 2% arsenic, 5% antimony, 18.6% tin, and the balance lead.

7. A tunnel diode device comprising: a body of P-type germanium semiconductor material having an amount of impurity of approximately $5\times10^{19}$ atoms per cubic centimeter; and a PN junction in said body established by alloying therewith a pellet containing by weight 2% arsenic, 5% antimony, 46.5% tin, and the balance lead.

8. A tunnel diode device comprising: a body of P-type germanium semiconductor material having an amount of impurity of approximately $5\times10^{19}$ atoms per cubic centimeter; and a PN junction in said body established by alloying therewith a pellet containing by weight 2% arsenic, 5% antimony, 70% tin, and the balance lead.

9. A tunnel diode device comprising: a body of P-type germanium semiconductor material doped with gallium and having an amount of impurity of substantially $5\times10^{19}$ atoms per cubic centimeter; a PN junction in said body established by alloying therewith a pellet containing by weight 2% arsenic, 5% antimony, tin within the range of 18.6 to 70%, and the balance lead; a conductive connection to said P-type body; and a conductive connection to said alloyed pellet.

10. The method of making a tunnel diode device comprising: alloying with a body of P-type germanium semiconductor material having an amount of impurity in the range of $1\times10^{19}$ to $1\times10^{20}$ atoms per cubic centimeter, a pellet containing by weight arsenic within the range of 0.1 to 5%, antimony within the range of 0.1 to 10%, tin within the range of 15 to 80%, and the balance lead.

11. The method of making a tunnel diode device comprising: heating an assembly of a body of P-type germanium semi-conductor material having an amount of impurity in the range of $1\times10^{19}$ to $1\times10^{20}$ atoms per cubic centimeter with a pellet containing by weight arsenic within the range of 0.1 to 5%, antimony within the range of 0.1 to 10%, tin within the range of 15 to 80%, and the balance lead from about room temperature to about 600° C. in several seconds, and thereafter cooling said assembly to room temperature to establish a very thin PN alloy junction.

12. The method of making a tunnel diode device comprising: heating an assembly of a body of P-type germanium semi-conductor material having an amount of impurity in the range of $1\times10^{19}$ to $1\times10^{20}$ atoms per cubic centimeter in contiguous relation with a pellet containing by weight arsenic within the range of 0.1 to 5%, antimony within the range of 0.1 to 10%, tin within the range of 15 to 80%, and the balance lead from about room temperature to about 600° C. in about 5 seconds, and thereafter cooling said assembly to room temperature to establish a very thin PN junction.

13. The method of making a tunnel diode device comprising: introducing at room temperature an assembly of a body of P-type germanium semiconductor material having an amount of impurity in the range of $1\times10^{19}$ to $1\times10^{20}$ atoms per cubic centimeter in contiguous relation with a pellet containing by weight arsenic within the range of 0.1 to 5%, antimony within the range of 0.1 to 10%, tin within the range of 15 to 80%, and the balance lead into an alloying furnace maintained at a temperature sufficient to raise the temperature of said assembly to about 600° C. in several seconds; immediately removing said assembly from said furnace to an atmosphere at about room temperature; and cooling said assembly to room temperature, thereby establishing a very thin PN alloy junction in said assembly.

14. A tunnel diode device manufactured according to the method of claim 10.

References Cited in the file of this patent

UNITED STATES PATENTS 2,983,854 Pearson ---------------- May 9, 1961